US009984755B2

(12) United States Patent
Jeong

(10) Patent No.: US 9,984,755 B2
(45) Date of Patent: May 29, 2018

(54) ONE-TIME PROGRAMMABLE (OTP) MEMORY DEVICE

(71) Applicant: Magnachip Semiconductor, Ltd., Cheongju-si (KR)

(72) Inventor: Duk Ju Jeong, Seoul (KR)

(73) Assignee: Magnachip Semiconductor, Ltd., Cheongju-si (KR)

(*) Notice: Subject to any disclaimer, the term of this patent is extended or adjusted under 35 U.S.C. 154(b) by 0 days. days.

(21) Appl. No.: 15/650,283

(22) Filed: Jul. 14, 2017

(65) Prior Publication Data

US 2018/0033488 A1 Feb. 1, 2018

(30) Foreign Application Priority Data

Jul. 27, 2016 (KR) .................. 10-2016-0095665

(51) Int. Cl.
| | | |
|---|---|---|
| *G11C 16/10* | (2006.01) | |
| *G11C 16/04* | (2006.01) | |
| *G11C 17/16* | (2006.01) | |
| *H01L 27/112* | (2006.01) | |
| *H01L 29/788* | (2006.01) | |
| *G11C 17/18* | (2006.01) | |
| *G11C 5/14* | (2006.01) | |

(52) U.S. Cl.
CPC ............ *G11C 16/10* (2013.01); *G11C 5/14* (2013.01); *G11C 16/0425* (2013.01); *G11C 17/16* (2013.01); *G11C 17/18* (2013.01); *H01L 27/11206* (2013.01); *H01L 29/788* (2013.01)

(58) Field of Classification Search
CPC .. G11C 16/10; G11C 16/3454; G11C 2216/14
See application file for complete search history.

(56) References Cited

U.S. PATENT DOCUMENTS

| | | | | |
|---|---|---|---|---|
| 5,781,476 A * | 7/1998 | Seki | ........................ | G11C 16/06 |
| | | | | 365/185.18 |
| 5,903,495 A * | 5/1999 | Takeuchi | ............ | G11C 11/5621 |
| | | | | 365/185.03 |
| 6,490,197 B1* | 12/2002 | Fasoli | ..................... | G11C 11/56 |
| | | | | 365/185.04 |
| 2008/0043532 A1* | 2/2008 | Hara | ....................... | G11C 16/10 |
| | | | | 365/185.12 |
| 2010/0220517 A1* | 9/2010 | Okayama | .................. | G11C 7/20 |
| | | | | 365/158 |

FOREIGN PATENT DOCUMENTS

KR   10-2009-0110525 A   10/2009

* cited by examiner

*Primary Examiner* — Tuan T Nguyen
(74) *Attorney, Agent, or Firm* — NSIP Law

(57) ABSTRACT

An OTP memory device includes an OTP memory cell array including OTP memory cells driven by an external supply voltage, the OTP memory cells comprising bit lines arrayed in rows and columns; data input circuits respectively connected to the rows of the OTP memory cells and configured to select a row of the OTP memory cells to which the supply voltage is to be applied; a column decoder connected to each column of the OTP memory cells and configured to select columns of the OTP memory cells to which the supply voltage is to be applied; and a detection amplifier connected to the bit line and configured to perform a read operation of the OTP memory cells.

20 Claims, 11 Drawing Sheets

ONE-TIME PROGRAMMABLE (OTP) MEMORY DEVICE

CROSS-REFERENCE TO RELATED APPLICATIONS

This application claims the benefit under 35 USC 119(a) of Korean Patent Application No. 10-2016-0095665 filed on Jul. 27, 2016 in the Korean Intellectual Property Office, the entire disclosure of which is incorporated herein by reference for all purposes.

BACKGROUND OF THE INVENTION

1. Field

The present application relates to a one-time programmable (OTP) memory device, and, more particularly, an OTP memory device that efficiently drives a plurality of OTP memory cells arrayed in rows and columns.

2. Description of Related Art

A memory is a device for storing information (data), and there are various types of the memory. A semi-conductive memory may be largely classified into a volatile memory and a non-volatile memory. Volatile memory retains data stored therein while powered on, but when the power is interrupted, the stored data is lost. On contrast, non-volatile memory maintains store data even when power is off.

OTP memory cell, according to existing technologies, is driven by a write word line, a bit line, and a source line. Programming an operation of the OTP memory cell may be performed by controlling the write word line, the bit line, and the source line differently. For example, a programmed cell applies 5.5V to the source line, whilst an unprogrammed cell applies 1.5V to the source line. As such, the existing technology is problematic because it is necessary to have a source line in order to drive an OTP memory cell and a voltage of the source line will be controlled differently depending on whether the cell is programmed. However, in existing technologies, if a cell array is driven using different voltages during a programming operation, the programming operation may not be performed accurately because of mismatched voltages as the OTP cell array needs to have multiple power lines routed therein.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an OTP memory device includes an OTP memory cell array including OTP memory cells driven by an external supply voltage, the OTP memory cells comprising bit lines arrayed in rows and columns; data input circuits respectively connected to the rows of the OTP memory cells and configured to select a row of the OTP memory cells to which the supply voltage is to be applied; a column decoder connected to each column of the OTP memory cells and configured to select columns of the OTP memory cells to which the supply voltage is to be applied; and a detection amplifier connected to the bit line and configured to perform a read operation of the OTP memory cells.

The OTP memory cells may be configured to perform a programming operation when simultaneously selected by one of the data input circuits and the column decoder.

The OTP memory cells may be configured to receive a write-data signal from the data input circuits and a column switch signal from the column decoder when selected simultaneously by one of the data input circuits and the column decoder.

Each of the OTP memory cells may not include a source line, and each of the OTP memory cells may be configured to perform the programming operation independent of the bit line when selected simultaneously by one of the data input circuits and the column decoder.

Each of the OTP memory cells may include a NAND gate configured to respectively receive the supply voltage from the data input circuits and the column decoder; a PMOS configured to turn on or off based on an output of the NAND gate; an OTP cell configured to perform the programming operation using the supply voltage when the PMOS is turned on; and an NMOS disposed between the bit line and the OTP cell.

Each of the OTP memory cells may turn on the PMOS to apply the supply voltage received via a source of the PMOS directly to the OTP cell when selected simultaneously by one of the data input circuits and the column decoder.

Each PMOS of two OTP memory cells may be coupled to one PMOS source.

The OTP memory device may further include a power selection circuit configured to receive the supply voltage from an external supply voltage pad, and provide the supply voltage to the OTP memory cells, the input circuits, and the column decoder.

The power selection circuit may be configured to select the supply voltage or a rated voltage VCI using first or second switching devices that are opened and closed based on a write enable signal and a write enablebar signal, and provide the selected voltage to the OTP memory cells, the data input circuits, and the column decoder.

The power selection circuit may be configured to shift a voltage level of the write enable signal and the write enablebar signal, and turn on one of the first and second switching devices to select the supply voltage or the rated voltage.

Each of the OTP memory cells may be configured to perform the programming operation using the supply voltage provided from the power selection circuit when selected simultaneously by the data input circuits and the column decoder.

A mesh structure routed on the OTP memory cell array may provide the supply voltage to the OTP memory cells through the power selection circuit.

The OTP memory device may further include an address decoder configured to shift a voltage level of a power voltage VDD to be converted into the supply voltage, and pre-decode the level-shifted supply voltage.

The column decoder may be configured to generate a read switch signal and a column switch signal based on the supply voltage pre-decoded by the address decoder, and provide the read switch signal and the column switch signal to the OTP memory cells.

The OTP memory device may further include bank addresses, each of the bank addresses may include the OTP memory cell array, the data input circuits, and the detection amplifier.

The OTP memory cells may be controlled by a single column decoder.

In another general aspect, an OTP memory device includes an OTP memory cell array including OTP memory cells driven by an external supply voltage and arrayed in rows and columns; data input circuits respectively connected to rows of the OTP memory cells and configured to select a row of the OTP memory cells to which the supply voltage is to be applied; a column decoder connected to each column of the OTP memory cells and configured to select columns of the OTP memory cells to which the supply voltage is to be applied; a power selection circuit configured to receive the supply voltage from an external supply voltage pad, and provide the supply voltage to the data input circuits, the column decoder, and the OTP memory cells; and an address decoder configured to shift a voltage level of a power voltage VDD to be converted into the supply voltage, and pre-decode the level-shifted supply voltage.

In another general aspect, an OTP memory device includes an OTP memory cell array including OTP memory cells driven by an external supply voltage, the OTP memory cells comprising a transistor and bit lines arrayed in rows and columns; data input circuits respectively connected to the rows of the OTP memory cells and configured to select a row of the OTP memory cells to apply the supply voltage; and a column decoder connected to each column of the OTP memory cells and configured to select columns of the OTP memory cells to apply the supply voltage, wherein adjacent transistors of the OTP memory cells are coupled to receive voltage from a single transistor source voltage.

Each of the OTP memory cells may include a NAND gate configured to respectively receive the supply voltage from the data input circuits and the column decoder; a PMOS configured to turn on or off based on an output of the NAND gate; an OTP cell configured to perform a programming operation using the supply voltage when the PMOS is turned on; and an NMOS disposed between the bit line and the OTP cell.

Each of the OTP memory cells may turn on the PMOS to apply the supply voltage received via a source of the PMOS directly to the OTP cell when selected simultaneously by one of the data input circuits and the column decoder.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
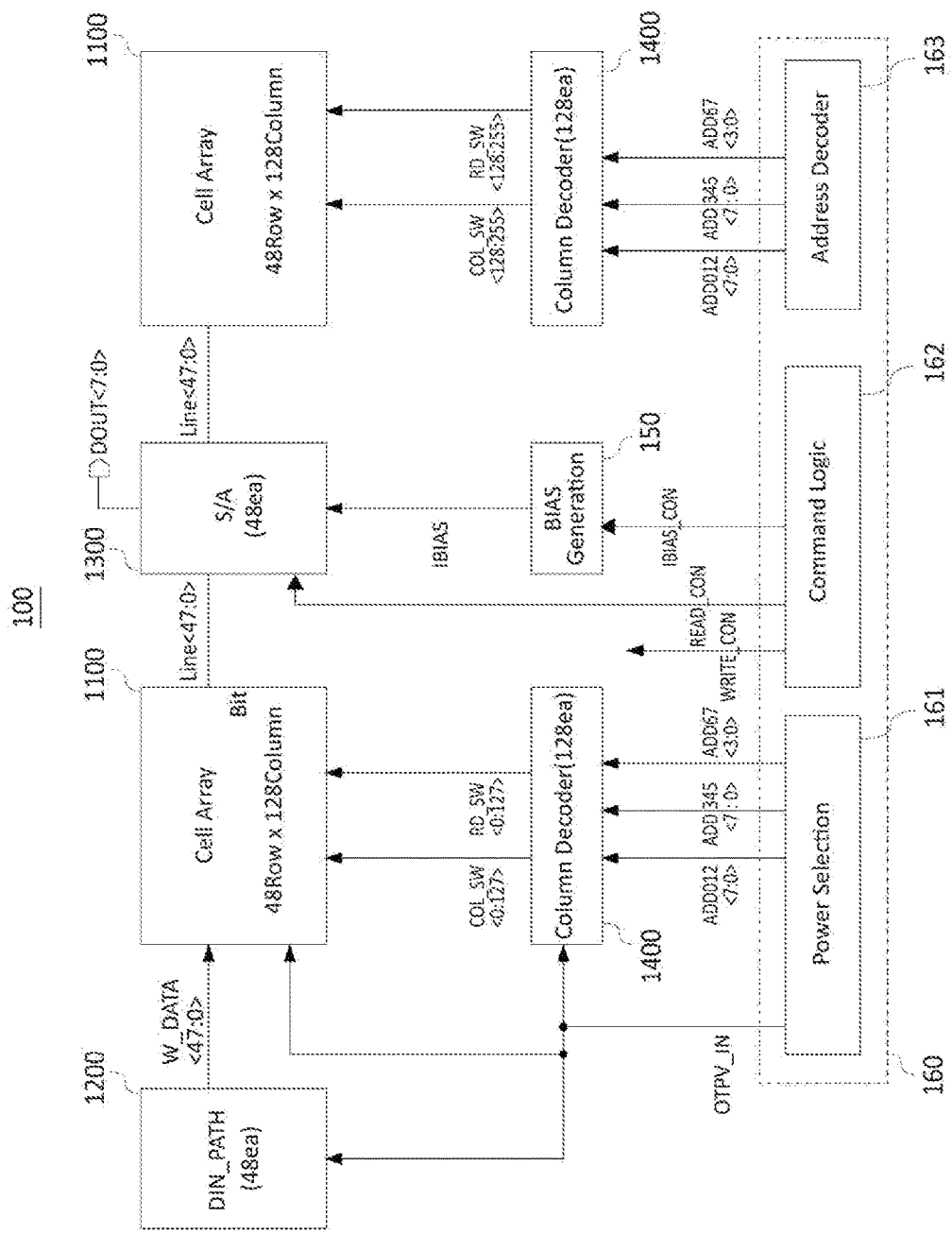
FIG. 1 is a block diagram illustrating an example of an OTP memory device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
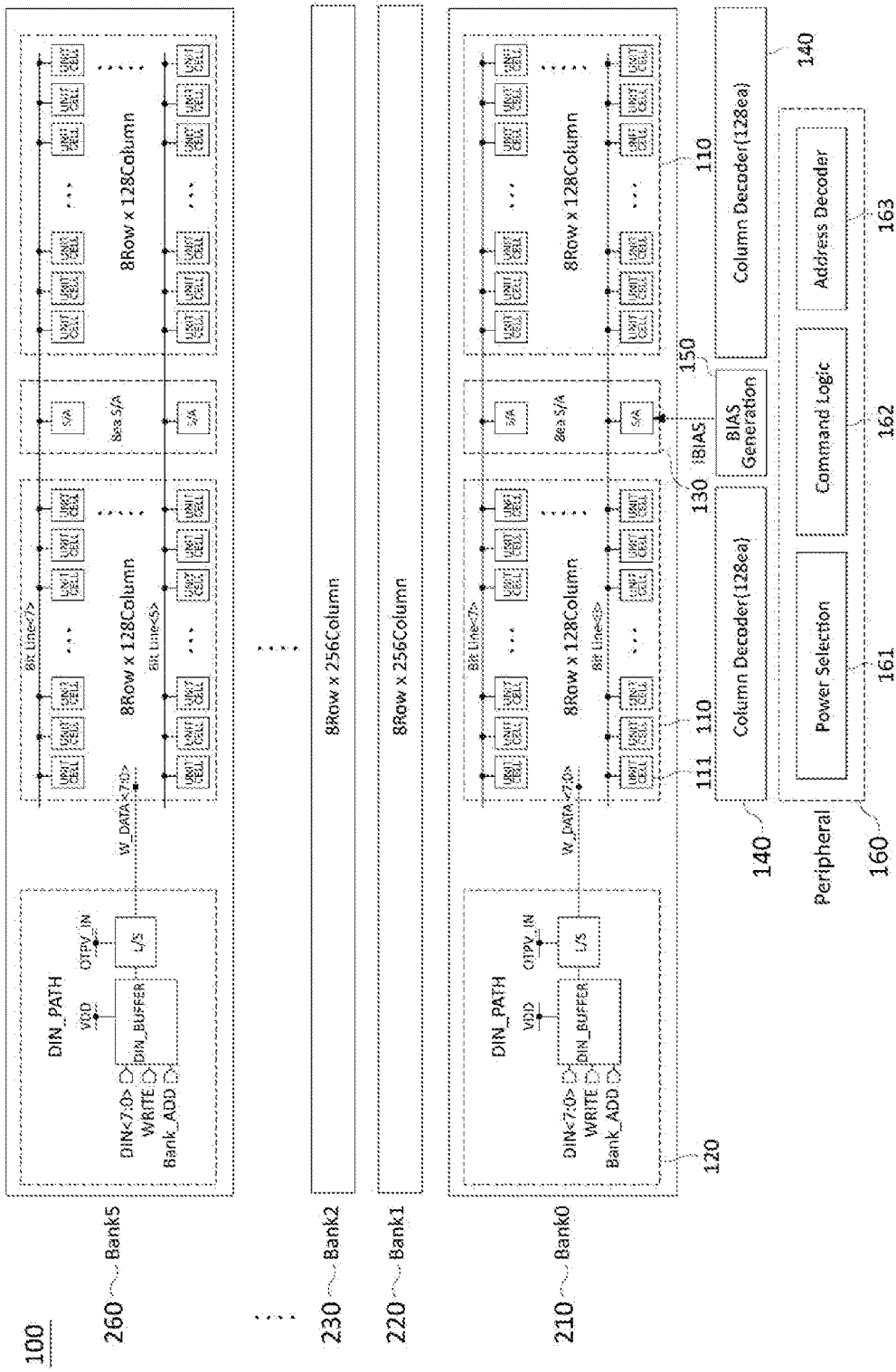
FIG. 2 is a block diagram depicting an example of a plurality of bank addresses of the OTP memory device shown in FIG. 1.

FIG. 1 is a bock diagram illustrating an example of an OTP memory device, and FIG. 2 is a block diagram of an example of a plurality of bank addresses of the OTP memory device shown in FIG. 1.

Referring to FIGS. 1 and 2, an OTP memory device 100 includes an OTP memory cell array 1100, data input circuits 1200, a detection amplification circuit 1300, a column decoder circuit 1400, a bias generation circuit 150, and a neighboring circuit 160. The neighboring circuit 160 may include a power selection circuit 161, a command logic circuit 162, and an address decoder 163. In details, the OTP memory cell array 1100 includes 8 OTP cell arrays 110 arrayed in rows and the data input circuits 1200 include 48 data input units 120 arrayed in rows. Each of the OTP cell array is connected to 8 data input units by bit lines respectively arrayed in rows. The detection amplification circuit 1300 includes 48 detection amplifiers, and the column decoder circuit 1400 includes 256 column decoders 140.

The OTP cell array 110 is driven by an external supply voltage OTPV_IN, and the plurality of OTP memory cells 111 including bit lines are arrayed in a rows and columns. The plurality of OTP memory cells 111 is connected to each of data input circuits 120 in the rows, and the plurality of OTP memory cells 111 is connected to each of the column decoder 140 in the columns.

If selected simultaneously by the plurality of data input units 120 and a column decoder 140, the plurality of OTP memory cells 111 performs a programming operation. Specifically, if selected simultaneously by eight data input units 120 and the column decoder 140 when performing a programming operation to program eight bits, eight OTP memory cells 111 receives a supply voltage OTPV_IN from eight data input units 120 and the column decoder 140, respectively. The rows and columns of the plurality of OTP memory cells 111 are selected simultaneously by the plurality of data input units 120 and the column decoder 140 in such a manner that a row of multiple OTP memory cells 111 is selected by the data input unit 120 and a column of multiple OTP memory cells 111 is selected by the column decoder 140. The plurality of OTP memory cells 111 selected by either the data input unit 120 or the column decoder 140 does not perform a programming operation.

Each of the data input units 120 is connected to each row of the plurality of OTP memory cells 111, thereby enabled to select rows of OTP memory cells 111, to which a supply voltage OTPV_IN is to be applied. More specifically, each of the data input units 120 provides a write-data signal W_DATA to the plurality of OTP memory cells 111 to select some of the plurality of OTP memory cells 111. For example, although it is not described in FIG. 2, a bank address 210 includes one OTP cell array 110, eight data input units 120 and eight detection amplifiers 130. The OTP cell array 110 includes a plurality of OTP memory cells 111 arranged in 8 rows and 128 columns.

The detection amplifier 130 is connected to bit lines, thereby enabled to perform read operation of a plurality of OTP memory cells. In one embodiment, the number of the detection amplifiers 130 is determined based on the number of rows of the plurality of OTP memory cells 111. For example, if the bank address 210 includes one OTP cell array 110 and the OTP cell array 110 includes a plurality of OTP memory cells 111 arranged in eight rows and 128 columns, eight detection amplifiers 130 are provided.

The column decoder 140 is connected to each column of the plurality of OTP memory cells 111, enabled to select columns of a plurality of OTP memory cells 111 to which a supply voltage OTPV_IN is to be applied. More specifically, the column decoder 140 provides a column switch signal COL_SW to the plurality of OTP memory cells 111 to select some of the plurality of OTP memory cells 111.

The bias generation circuit 150 generates a bias current IBIAS and provide the bias current BIAS to the detection amplifier 130. In one embodiment, if the OTP memory device 100 includes a plurality of bank addresses 210 to 260, the OTP memory device 100 provides a bias current BIAS to the detection amplifiers 130 included in the plurality of bank addresses 210 to 260 via a single bias generation circuit 150.

In one embodiment, if the OTP memory device 100 includes the plurality of bank addresses 210 to 260, the OTP memory device 100 controls the plurality of bank addresses 210 to 260 using a single neighboring circuit 160. The power selection circuit 161 receives a supply voltage OTPV_IN from an external supply voltage pad, and provides the supply voltage OTPV_IN to the plurality of OTP memory cells 111, the plurality of data input units 120, and the column decoder 140. The command logic circuit 162 provides a control signal to perform a programming operation or read operation of the plurality of OTP memory cells 111. The address decoder 163 shifts a voltage level of a power voltage VDD to be converted into a supply voltage OTPV_IN, and pre-decode the level-shifted supply voltage.

In an example, the OTP memory device 100 further includes a plurality of bank addresses 210 to 260. Each of the plurality of bank addresses 210 to 260 includes an OTP cell array 110, a plurality of data input units 120, and a plurality of detection amplifiers 130. In one embodiment, each of the plurality of bank addresses 210 to 260 includes a plurality of OTP cell arrays 110. The rows of the plurality of OTP memory cell arrays is aligned along the plurality of data input units 120. A single column decoder 140 and a single bias generation circuit 150 included in each of the plurality of bank addresses 210 to 260 controls the plurality of OTP memory cells 111. Therefore, the OTP memory device 100 controls the plurality of bank addresses 210 to 260 using the single column decoder 140 and the single bias generation circuit 150, thereby reducing the circuit layout size.

Figure 3:
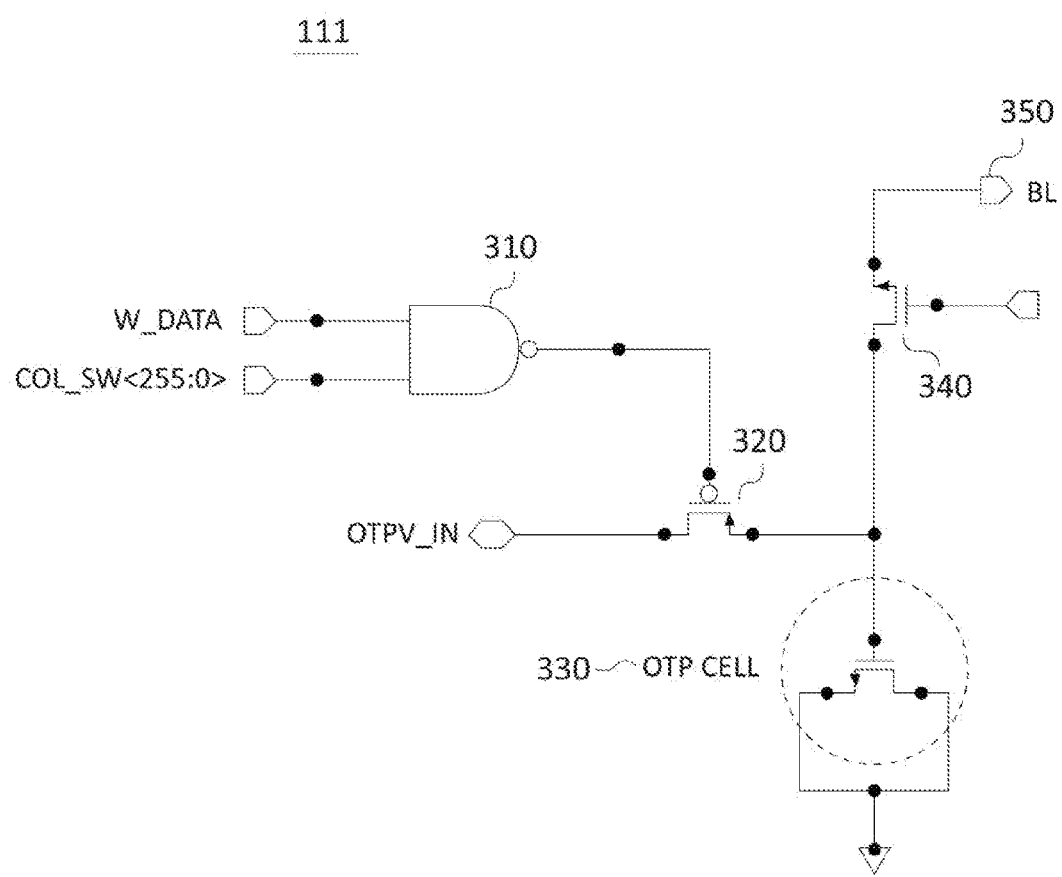
FIG. 3 is a diagram depicting an example of an OTP memory cell of the OTP memory device shown in FIG. 1.
Figure 4:
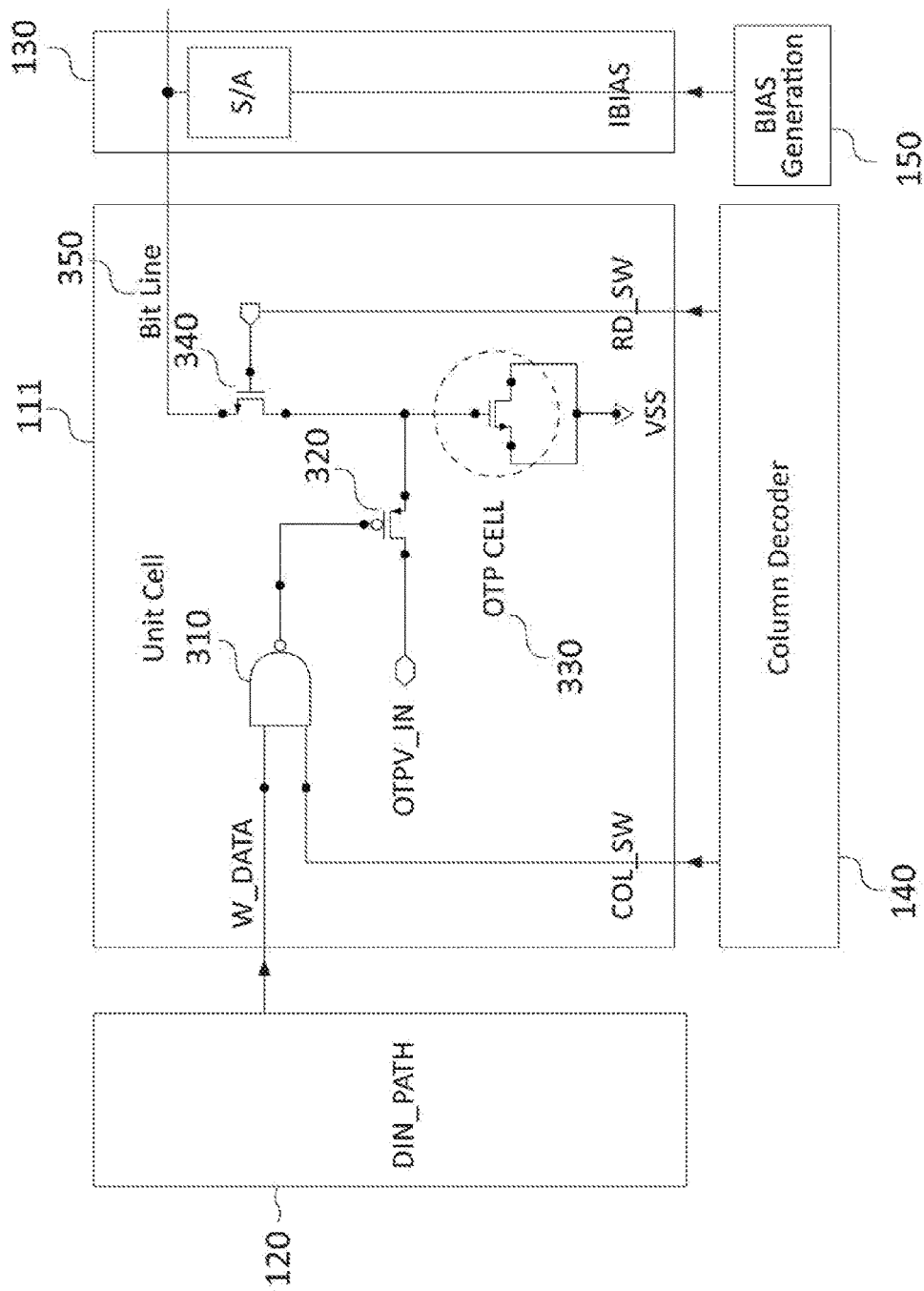
FIG. 4 is a diagram depicting an example of the structure of an OTP memory cell, a data input circuit, a detection amplifier, and a column decoder in the OTP memory device shown in FIG. 1.

FIG. 3 is a diagram of an example of an OTP memory cell of the OTP memory device shown in FIG. 1, and FIG. 4 is a diagram of an example of the structure of an OTP memory cell, a data input circuit, a detection amplifier, and a column decoder in the OTP memory device shown in FIG. 1.

Referring to FIGS. 3 and 4, each of the plurality of OTP memory cells 111 includes an NAND gate 310, a PMOS 320, an OTP cell 330, an NMOS 340, and a bit line 350.

The NAND gate 310 receives a write-data signal W_DATA from the data input unit 120, and a column switch signal COL_SW from the column decoder 140. The NAND gate 310 outputs a low level (or 0) if it simultaneously receives the write-data signal W_DATA from the data input circuit 120 and the column switch signal COL_SW from the column decoder 140. The output of the NAND gate 310 is connected to a gate of the PMOS 320.

The PMOS 320 is turned on or off by the output of the NAND gate 310. For example, if the output of the NAND gate 310 corresponds to a low level (or 0), the PMOS 320 is turned on, and, if the output of the NAND gate 310 corresponds to a high level (or 1), the PMOS 320 is turned off. That is, if the NAND gate 310 receives the write-data signal W_DATA and the column switch signal COL_SW simultaneously, the PMOS 320 is turned on.

The source of the PMOS 320 receives a supply voltage OTPV_N from the power selection circuit 161. When the PMOS 320 is turned on, the PMOS 320 supplies the supply voltage OTPV_IN, applied to the source, to the OTP cell 330.

When the PMOS 320 is turned on, the OTP cell 330 performs a programming operation using the supply voltage OTPV_IN. In one embodiment, the OTP cell 330 is implemented as an NMOS, and receives a supply voltage OTPV_IN via its gate. When the OTP cell 330 receives the supply voltage OTPV_IN, the gate oxide is blown, thereby resulting in a short circuit between the gate and a P-Well. That is, when the OTP cell 330 receives the supply voltage OTPV_IN, a gate and a P-Well of the OTP cell 330 is connected and, thus, the supply voltage OTPV_IN is discharged to the ground voltage VSS. Therefore, each of the plurality of OTP memory cells 111 does not include a source line, and, when selected simultaneously by the data input units 120 and the column decoder 140, each of the plurality of OTP memory cells 111 performs a programming operation independent of the bit line 350.

In one embodiment, if selected simultaneously by the data input units 120 and the column decoder 140, each of the plurality of OTP memory cells 111 performs a programming operation using the supply voltage OTPV_IN that is supplied from the power selection circuit 161. That is, each of the plurality of OTP memory cells 111 does not include an additional source line so an additional voltage is not required, and thus, the OTP memory device 100 is configured in minimum size with minimum costs.

In one embodiment, if selected simultaneously by the data input unit 120 and the column decoder 140, each of the plurality of OTP memory cells 111 turns on the PMOS 320 to apply a supply voltage OTPV_IN, received via a source of the PMOS 320, directly to the OTP cell 330.

The NMOS 340 is disposed between the bit line 350 and the OTP cell 330. More specifically, the NMOS 340 is turned on in response to reception of a read switch signal RD_SW from the column decoder 140. When the NMOS 340 is turned on, the OTP cell 330 performs read operation using a voltage of the bit line 350.

In one embodiment, when read operation of the OTP cell 330 is performed, the data input unit 120 does not provide a write-data signal W_DATA to the OTP memory cell. That is, when read operation of the OTP cell 330 is performed, the write-data signal W_DATA corresponds to a low level (or 0), and the PMOS 320 is turned off.

For example, when read operation of the OTP cell 330 is performed, a DIN input and a write-data signal all correspond to a low level (or 0), and the PMOS 320 of the OTP memory cell 111 remains turned-off. The column decoder 140 provides a read switch signal RD_SW to the NMOS 340 to turn on the NMOS 340. When the OTP cell 330 is programmed and the NMOS 340 is turned on, a voltage of the bit line 350 is discharged to the ground voltage VSS. But when OTP cell 330 is unprogrammed and the NMOS 340 is turned on by the read switch signal RD_SW, a voltage of the bit line 350 remains at a high level (or 1) because the blowing of the OTP cell 330 will not occur.

Figure 5:
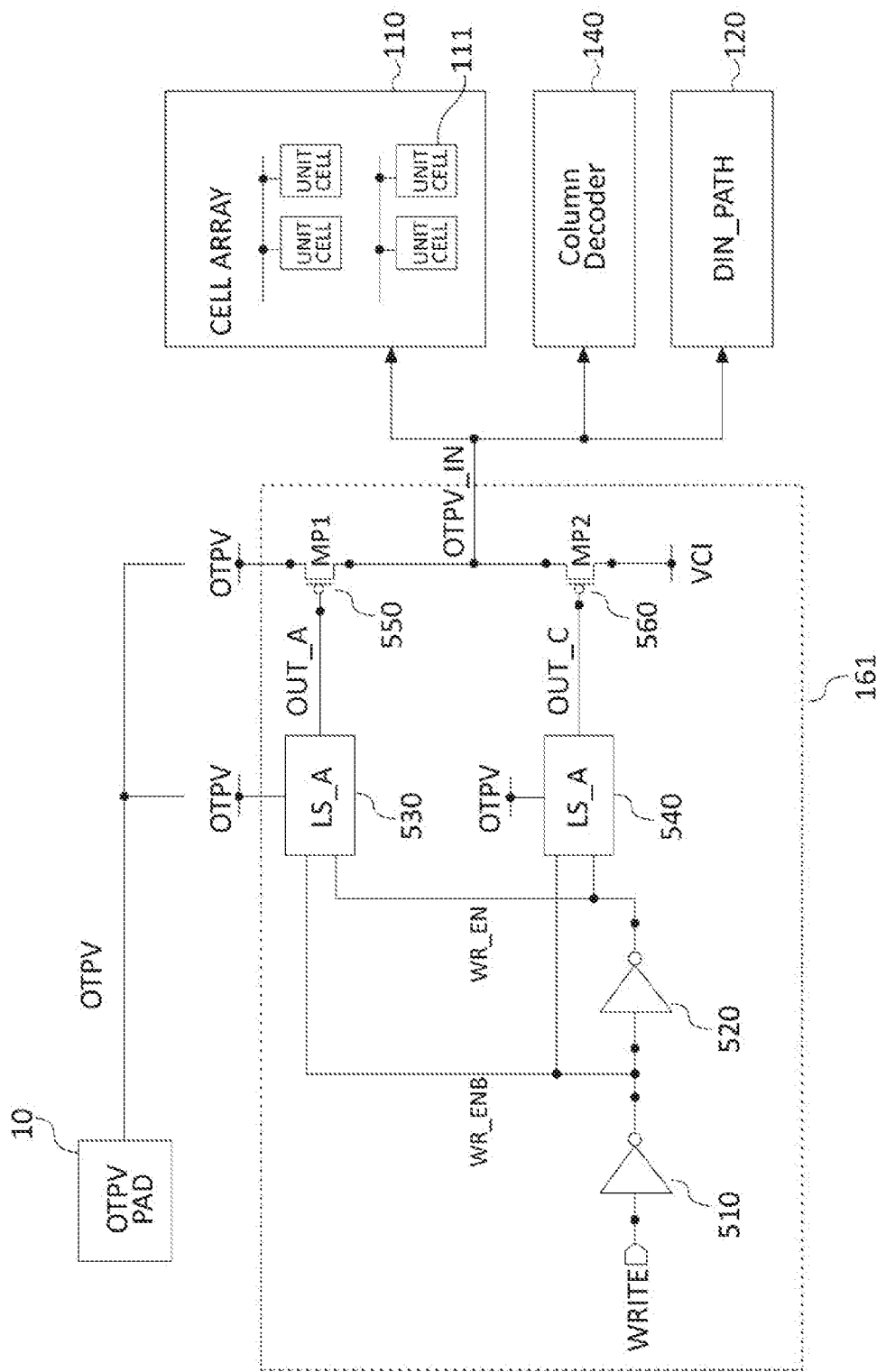
FIG. 5 is a circuit diagram illustrating an example of a power selection circuit of the OTP memory device shown in FIG. 1.

FIG. 5 is a circuit diagram illustrating an example of a power selection circuit of the OTP memory device shown in FIG. 1.

Referring to FIG. 5, the power selection circuit 161 receives a voltage OTPV supplied from an external supply voltage pad 10, and provide a supply voltage OTPV_IN to a plurality of OTP memory cells 111, a data input unit 120, and a column decoder 140. The voltage OTPV supplied from the external pad and the supply voltage OTPV_IN are the same voltage. For convenience of explanation, the voltage outside the power selection circuit 161 is referred to as the voltage OTPV, and the voltage inside the power selection circuit 161 is referred to as the supply voltage OTPV_IN. More specifically, the power selection circuit 161 includes first NOT gate 510 and second NOT gate 520, first level shifter 530 and second level shifter 540, and first switching device 550 and second switching device 560. The power selection circuit 161 selects a supply voltage OTPV_IN or a rated voltage VCI using the first switching device 550 and the second switching device 560, which are opened or closed in accordance with a write enable signal WR_EN and a write enablebar signal WR_ENB. The power selection circuit 161 provides the selected voltage to the plurality of OTP memory cells 111, the data input unit 120, and the column decoder 140. That is, the power selection circuit 161 shifts levels of the write enable signal WR_EN and the write enablebar signal WR_ENB, and turns on one of the first switching device 550 and the second switching device 560 to select the supply voltage OTPV_IN or the rated voltage VCI. The supply voltage OTPV_IN has a voltage level higher than that of the rated voltage VCI.

The first NOT gate 510 and the second NOT gate 520 are connected in serial, so an output of the first NOT gate 510 is applied as an input of the second NOT gate 520. That is, respective outputs of the first NOT gate 510 and the second NOT gate 520 are different. In one embodiment, the power selection circuit 161 receives a write signal WRITE, and the first NOT gate 510 and the second NOT gate 520 generate a write enable signal WR_EN and a write enable bar signal WR_ENB using the first NOT gate 510 and the second NOT gate 520. Each of the first level shifter 530 and the second level shifter 540 receives the write enable signal WR_EN and the write enablebar signal WR_ENB, shift the signals into a supply voltage OPTV_IN, and provide the supply voltage OPTV_IN to the first switching device 550 and the second switching device 560.

In one embodiment, when the programming operation of the plurality of OTP memory cells 111 is performed, the power selection circuit 161 receives a write signal WRITE of the high level (or 1). When the power selection circuit 161 receives the write signal WRITE of the high level (or 1), the write enablebar signal WR_ENB corresponds to the low level (or 0) and the write enable signal WR_EN corresponds to the high level (or 1). If the write enablebar signal WR_ENB corresponds to the low level (or 0) and the write enable signal WR_EN corresponds to the high level (or 1), the first level shifter 530 outputs the low level (or 0) to turn on the first switching device 550, and the second level shifter 540 outputs the high level (or 1) to turn off the second switching device 560. That is, when a programming operation of the plurality of OTP memory cells 111 is performed, the power selection circuit 161 turns on the first switching device 550 to provide a supply voltage OTPV_IN to the plurality of OTP memory cells 111, the data input unit 120, and the column decoder 140.

In one embodiment, when a read operation of the plurality of OTP memory cells 111 is performed, the power selection circuit 161 receives a write signal WRITE of a low level (or 0). When the power selection circuit 161 receives the low level (or 0), the write enablebar signal WR_ENB corresponds to a high level (or 1) and the write enable signal WR_EN corresponds to a low level (or 0). If the write enablebar signal WR_ENB corresponds to the high level (or 1) and the write enable signal WR_EN corresponds to the low level (or 0), the first level shifter 530 outputs the high level (or 1) to turn off the first switching device 550 and the second level shifter 540 outputs the low level (or 0) to turn on the second switching device 560. That is, when a read operation of the plurality of OTP memory cells 111 is performed, the power switching device 161 turns on the second switching device 560 to provide the rated voltage VCI to the plurality of OTP memory cells 111, the data input unit 120, and the column decoder 140.

Figure 6:
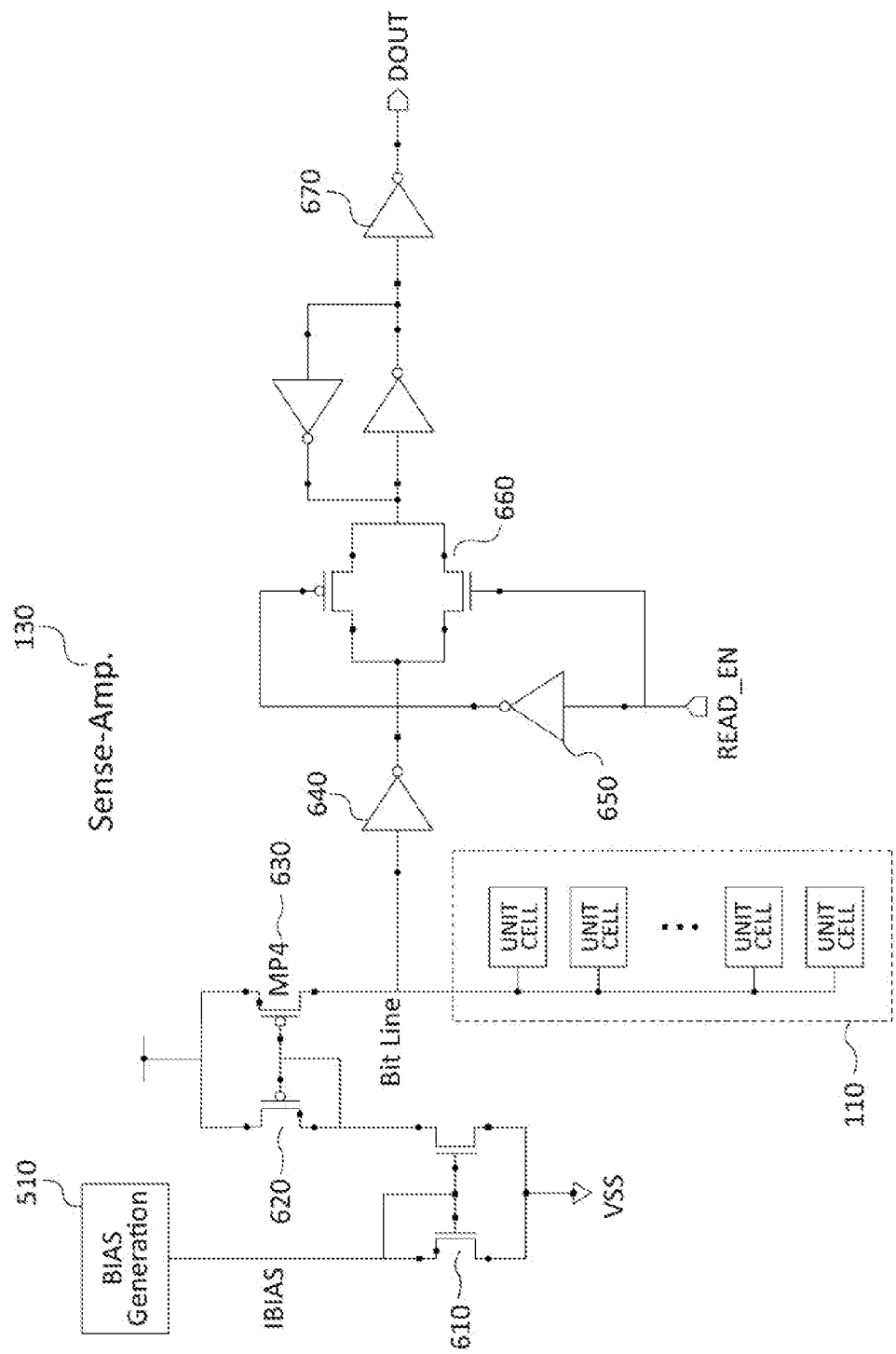
FIG. 6 is a circuit diagram illustrating an example of a detection amplifier of the OTP memory device shown in FIG. 1.

FIG. 6 is a circuit diagram illustrating an example of a detection amplifier of the OTP memory device shown in FIG. 1.

Referring to FIG. 6, the detection amplifier 130 includes a current mirror 610, third switching device 620 and fourth switching device 630, third NOT gate 640 and fourth NOT gate 650, a transmission, and a fifth NOT gate 670.

The detection amplifier 130 receives a bias current BIAS from the bias generation circuit 150, and copies the bias current using the current mirror 610. The current copied by the current mirror 610 is copied again due to the structure of the third switching device 620 and the fourth switching device 630. Using the current mirror 610, the third switching device 620 and the fourth switching device 630, the detection amplifier 130 controls an amount of currents flowing in the fourth switching device 630.

In one embodiment, when read operation of a plurality of programmed OTP memory cells 111 is performed, each NMOS 340 of the plurality of programmed OTP memory cells 111 is turned on by receipt of a read switch signal RD_SW. When each NMOS 340 of the plurality of OTP memory cells 111 is turned on, the OTP cell receives a voltage of the bit line 350. When the OTP cell 330 receives the voltage of the bit line 350, it results in a short circuit between its gate and its P-Well through the blown gate oxide. That is, if the OTP cell 330 receives the voltage of the bit line 350, a gate and a P-Well of the OTP cell 330 are connected and results in the voltage of the bit line 350 being discharged to the ground voltage VSS. When the voltage of the bit line 350 is discharged to the ground voltage VSS, the detection amplifier 130 receives a read enable signal READ_EN and, thus, an output DOUT of the detection amplifier 130 is latched into a high level (or 1).

Figure 7:
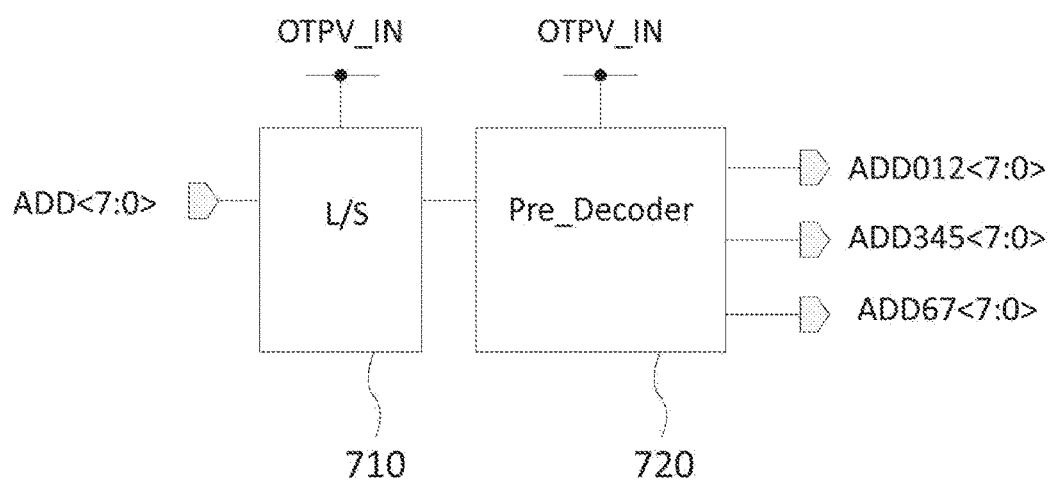
FIG. 7 is a diagram of an example of an address decoder of the OTP memory device shown in FIG. 1.
Figure 8:
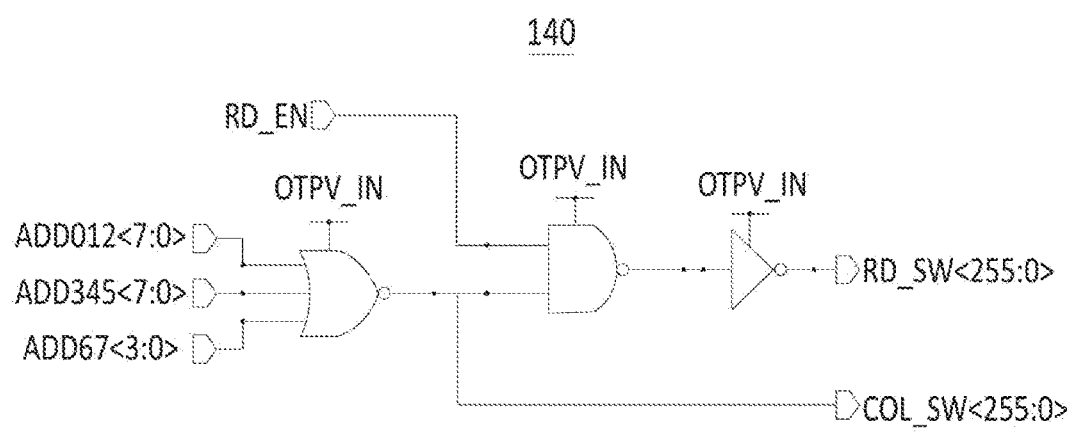
FIG. 8 is a diagram of an example of a column decoder of the OTP memory device shown in FIG. 1.

FIG. 7 is a diagram of an example of an address decoder of the OTP memory device shown in FIG. 1, and FIG. 8 is a diagram of an example of a column decoder of the OTP memory device shown in FIG. 1.

Referring to FIG. 7, the address decoder 163 includes a third level shifter 710 and a pre-decoder 720. The address decoder 163 shifts a voltage level of an address signal (ADD<7:0>), which has a voltage level of a VDD power voltage, to be converted into a supply voltage OTPV_IN using the third level shifter 710, and pre-decodes the level-shifted supply voltage OTPV_IN using the pre-decoder 720. The pre-decoder 720 decodes an input address signal (ADD<7:0>) into (ADD012<7:0>, ADD345<7:0>, ADD67<3:0>), and outputs the decoded signal. For example, the address decoder 163 receives an address signal (ADD<7:0>), having a VDD voltage level, and outputs an address signal (ADD012<7:0>, ADD345<7:0>, ADD67<3:0>), which has a voltage level of the supply voltage OTPV_IN.

Referring to FIG. 8, the column decoder 140 generates a read switch signal RD_SW and column switch signal COL_SW based on the pre-decoded address signal (ADD012<7:0>, ADD345<7:0>, ADD67<3:0>), and provides the generated signals to the plurality of OTP memory cells 111. For example, the column decoder 140 provides a column switch signal COL_SW to a second input stage of the NAND gate 310, and provides a read switch signal RD_SW to a gate of the NMOS 340.

Figure 9:
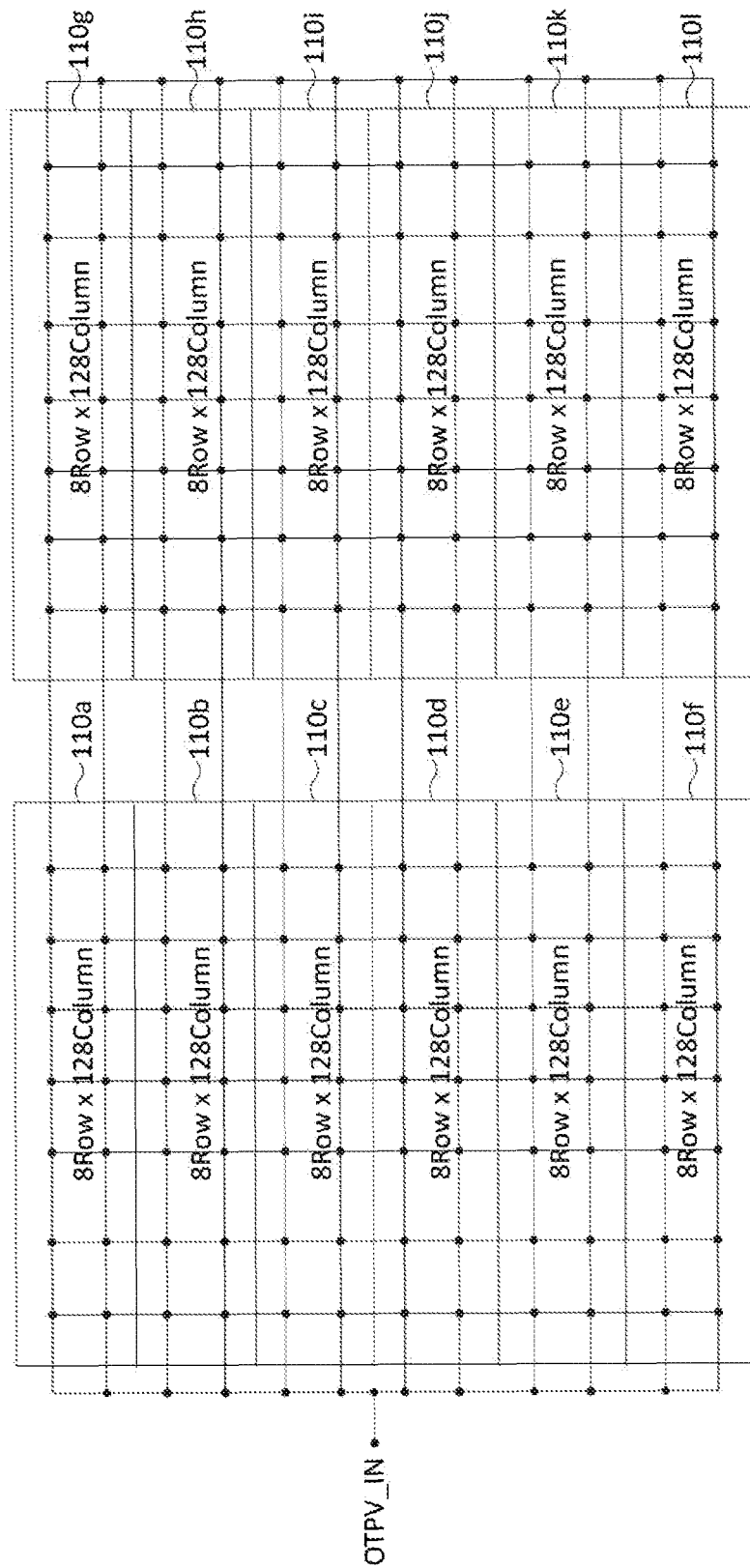
FIG. 9 is a diagram illustrating an example of a structure in which a power selection circuit of the OTP memory device shown in FIG. 1 provides a supply voltage.

FIG. 9 is a diagram illustrating an example of a structure in which a power selection circuit of the OTP memory device shown in FIG. 1 provides a supply voltage.

Referring to FIG. 9, the power selection circuit 161 provides a supply voltage OTPV_IN to the plurality of OTP memory cells 111 by way of a mesh structure that is routed on the OTP cell array 110. In one embodiment, the power selection circuit 161 routes lines of the supply voltage OTPV_IN in a mesh structure on the plurality of OTP cell arrays 110*a* to 1101 to be connected to a source of each PMOS 320 of the plurality of OTP memory cells 111. Therefore, the OTP memory device 100 turns on each PMOS 320 of multiple memory cells 111, which are expected to perform a programming operation, to connect the supply voltage OTPV_IN directly to the OTP cell 330. The OTP memory device 100 applies a supply voltage, received from an external supply voltage pad 10, directly to the OTP cell 330 by way of the mesh structure. The applied supply voltage prevents a drop of the supply voltage of the supply voltage OTPV_IN during the programming operation and allows accurately application of the target supply voltage OTPV_ON to the OTP cell 330.

Figure 10:
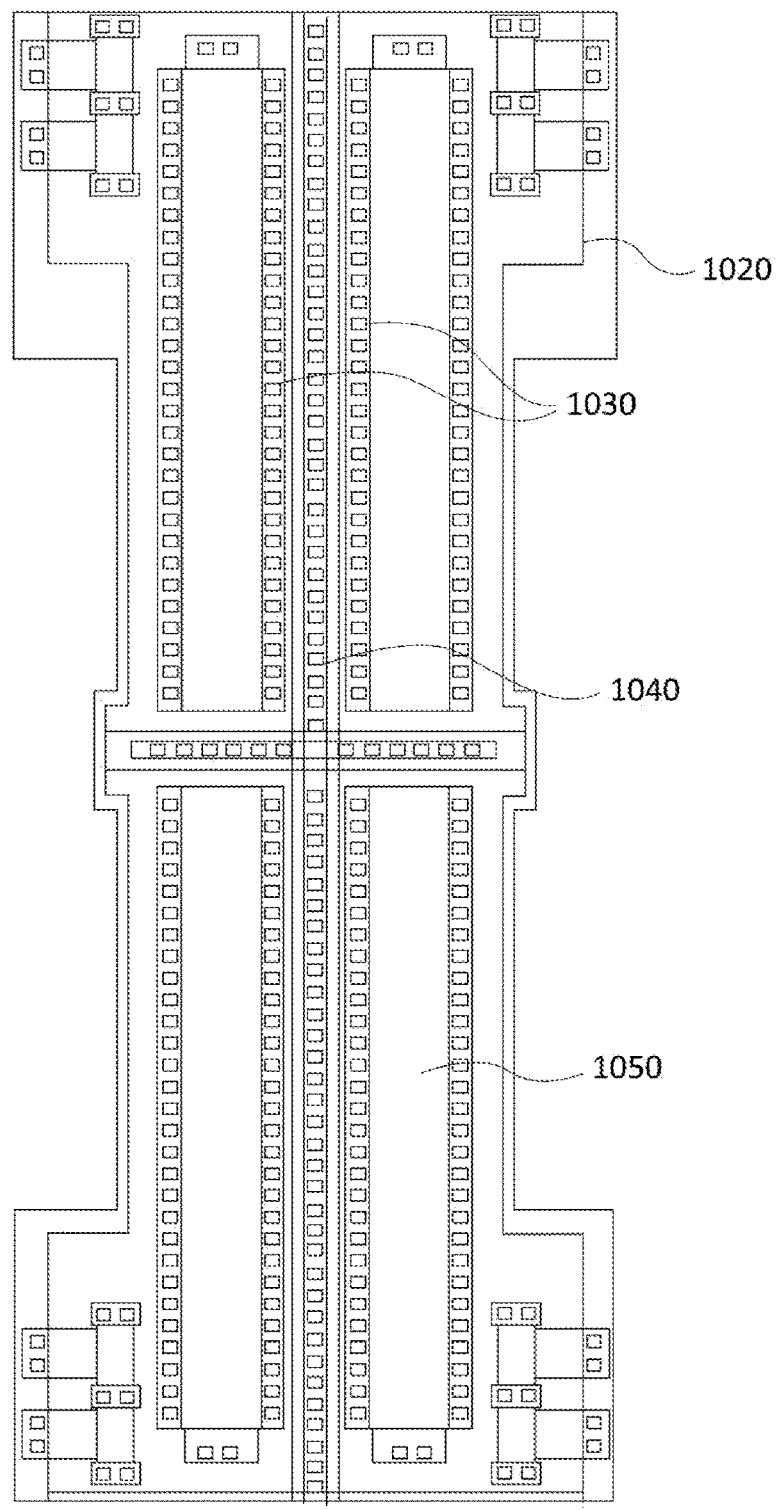
FIG. 10 is a diagram illustrating a conventional layout of a PMOS of an OTP memory device.
Figure 11:
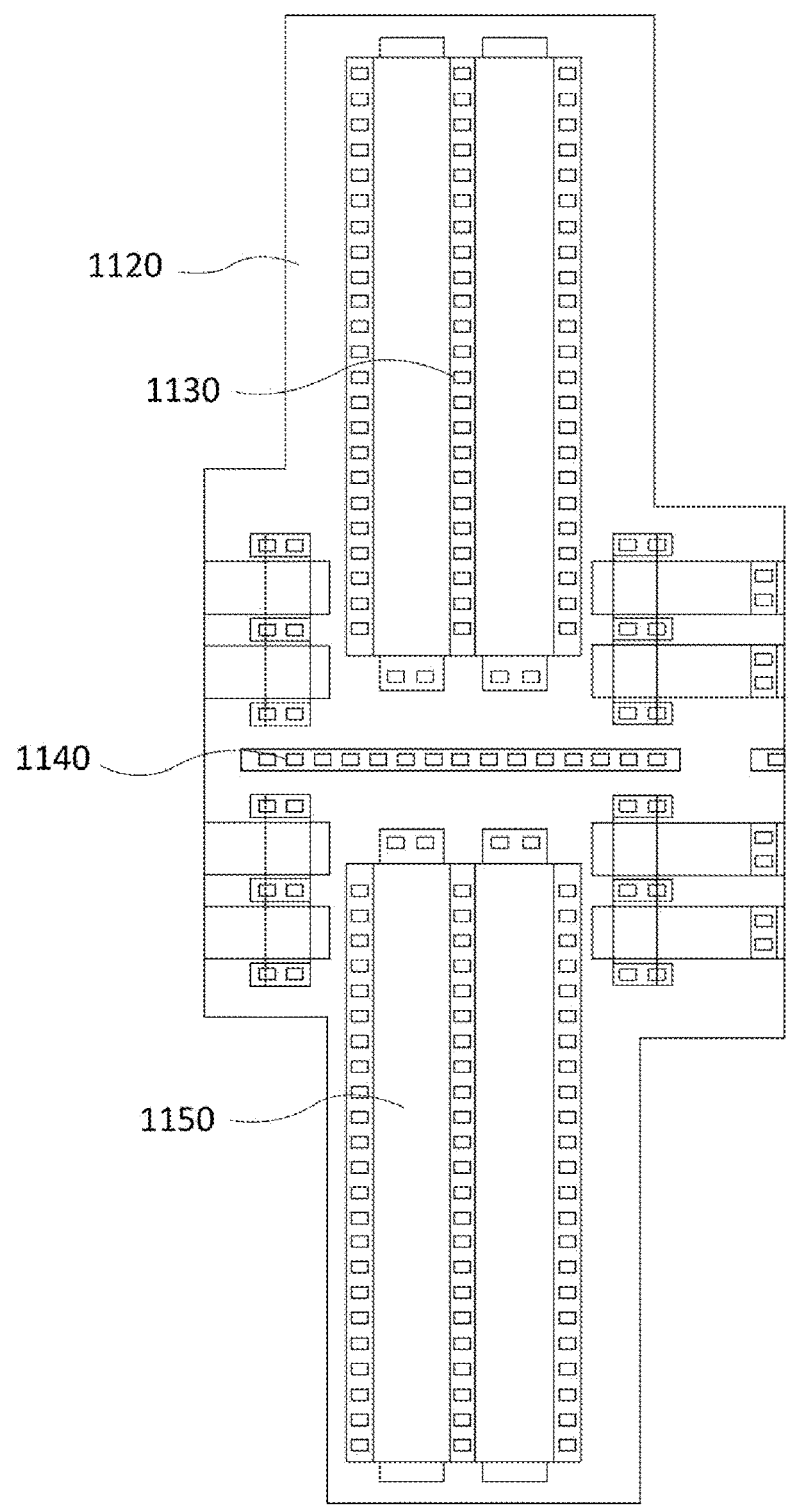
FIG. 11 is a diagram illustrating an example of a layout of a PMOS of the OTP memory device shown in FIG. 1.

FIG. 10 is a diagram illustrating a conventional layout of a PMOS of an OTP memory device, and FIG. 11 is a diagram illustrating a layout of an example of a PMOS of the OTP memory device shown in FIG. 1.

Referring to FIG. 10, the OTP memory device according to the existing technology includes an N-Well 1020, a PMOS source 1030, a bulk bias 1040, and a PMOS gate 1050. In the OTP memory device, a plurality OTP memory cells each includes a different PMOS source 1030. In addition, the OTP memory device includes the bulk bias 1040 between two PMOS sources 1030 resulting in an increased layout size.

Referring to FIG. 11, the OTP memory device 100 includes an N-Well 1120, a PMOS source 1130, a bulk bias 1140, and a PMOS gate 1150. The plurality of OTP memory cells 111 is laid out such that each PMOS of two OTP memory cells share the same PMOS source 1130 with the other. Therefore, the area of the bulk bias 1140 in the OTP memory device 100 is significantly reduced, resulting in a reduced size of the layout area.

The disclosed OTP memory device 100 includes a plurality of OTP memory cells that receives an external supply voltage OTPV_IN and is driven by a bit line, without a source line and arrayed in rows and columns. The OTP memory device 100 performs a programming operation without the need of an additional voltage other than the supply voltage OTPV_IN, and includes a plurality of OTP memory cells that performs the programming operation independent of bit lines when the cells are selected simultaneously by a plurality of data input units and a column decoder. In addition, the OTP memory device 100 drives a plurality of OTP memory cell arrays using a single column decoder and a single bias generation circuit, and includes a plurality of OTP memory cells that are laid out such that each PMOS of two OTP memory cells share the same PMOS source with each other.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An OTP memory device, comprising:
   an OTP cell array comprising OTP memory cells driven by an external supply voltage, the OTP memory cells comprising bit lines arrayed in rows and columns;
   data input units respectively connected to the rows of the OTP memory cells and configured to select one of the rows of the OTP memory cells to which the supply voltage is to be applied;
   a column decoder connected to each column of the OTP memory cells and configured to select one of the columns of the OTP memory cells to which the supply voltage is to be applied; and
   a detection amplifier connected to the bit line and configured to perform a read operation of the OTP memory cells.

2. The OTP memory device of claim 1, wherein the OTP memory cells are configured to perform a programming operation when simultaneously selected by the data input unit and the column decoder.

3. The OTP memory device of claim 2, wherein the OTP memory cells are configured to receive a write-data signal from the data input unit and a column switch signal from the column decoder when selected simultaneously by the data input unit and the column decoder.

4. The OTP memory device of claim 1,
   wherein each of the OTP memory cells does not comprise a source line, and
   wherein each of the OTP memory cells is configured to perform the programming operation independent of the bit line when selected simultaneously by the data input unit and the column decoder.

5. The OTP memory device of claim 1, wherein each of the OTP memory cells comprises:
   a NAND gate configured to respectively receive the supply voltage from the data input unit and the column decoder;
   a PMOS configured to turn on or off based on an output of the NAND gate;
   an OTP cell configured to perform the programming operation using the supply voltage when the PMOS is turned on; and
   an NMOS disposed between the bit line and the OTP cell.

6. The OTP memory device of claim 5, wherein each of the OTP memory cells turns on the PMOS to apply the supply voltage received via a source of the PMOS directly to the OTP cell when selected simultaneously by the data input unit and the column decoder.

7. The OTP memory device of claim 5, wherein each PMOS of two OTP memory cells are coupled to one PMOS source.

8. The OTP memory device of claim 1, further comprising a power selection circuit configured to receive the supply voltage from an external supply voltage pad, and provide the supply voltage to the OTP memory cells, the data input unit, and the column decoder.

9. The OTP memory device of claim 8, wherein the power selection circuit is configured to select the supply voltage or a rated voltage VCI using first or second switching devices that are opened and closed based on a write enable signal and a write enablebar signal, and provide the selected voltage to the OTP memory cells, the data input unit, and the column decoder.

10. The OTP memory device of claim 9, wherein the power selection circuit is configured to shift a voltage level of the write enable signal and the write enablebar signal, and turn on one of the first and second switching devices to select the supply voltage or the rated voltage.

11. The OTP memory device of claim 8, wherein each of the OTP memory cells is configured to perform the programming operation using the supply voltage provided from the power selection circuit when selected simultaneously by the data input unit and the column decoder.

12. The OTP memory device of claim 8, wherein a mesh structure routed on the OTP memory cell array provides the supply voltage to the OTP memory cells through the power selection circuit.

13. The OTP memory device of claim 1, further comprising an address decoder configured to shift a voltage level of a power voltage VDD to be converted into the supply voltage, and pre-decode the level-shifted supply voltage.

14. The OTP memory device of claim 13, wherein the column decoder is configured to generate a read switch signal and a column switch signal based on the supply voltage pre-decoded by the address decoder, and provide the read switch signal and the column switch signal to the OTP memory cells.

15. The OTP memory device of claim 1, further comprising bank addresses, each of the bank addresses comprising the OTP cell array, the data input unit, and the detection amplifier.

16. The OTP memory device of claim 15, wherein the OTP memory cells is controlled by a single column decoder.

17. An OTP memory device, comprising:
- an OTP cell array comprising OTP memory cells driven by an external supply voltage and arrayed in rows and columns;
- data input units respectively connected to rows of the OTP memory cells and configured to select one of the rows of the OTP memory cells to which the supply voltage is to be applied;
- a column decoder connected to each column of the OTP memory cells and configured to select one of the columns of the OTP memory cells to which the supply voltage is to be applied;
- a power selection circuit configured to receive the supply voltage from an external supply voltage pad, and provide the supply voltage to the data input unit, the column decoder, and the OTP memory cells; and
- an address decoder configured to shift a voltage level of a power voltage VDD to be converted into the supply voltage, and pre-decode the level-shifted supply voltage.

18. An OTP memory device, comprising:
- an OTP cell array comprising OTP memory cells driven by an external supply voltage, the OTP memory cells comprising a transistor and bit lines arrayed in rows;
- data input units respectively connected to the rows of the OTP memory cells and configured to select one of the rows of the OTP memory cells to apply the supply voltage; and
- a column decoder connected to each column of the OTP memory cells and configured to select one of the columns of the OTP memory cells to apply the supply voltage,
- wherein each transistor of the two OTP memory cells share same source with each other.

19. The OTP memory device of claim 18, wherein each of the OTP memory cells comprises:
- a NAND gate configured to respectively receive the supply voltage from the data input unit and the column decoder;
- a PMOS configured to turn on or off based on an output of the NAND gate;
- an OTP cell configured to perform a programming operation using the supply voltage when the PMOS is turned on; and
- an NMOS disposed between the bit line and the OTP cell.

20. The OTP memory device of claim 19, wherein each of the OTP memory cells turns on the PMOS to apply the supply voltage received via a source of the PMOS directly to the OTP cell when selected simultaneously by the data input unit and the column decoder.

\* \* \* \* \*